July 18, 1972 T. A. ANZELONE, JR., ET AL 3,677,853

WAFER MOUNTING

Filed Dec. 30, 1969

INVENTORS
THOMAS A. ANZELONE, JR
HAROLD A. LARSON
ALFRED A. STRICKER

BY Earl C. Hancock
ATTORNEY

United States Patent Office 3,677,853
Patented July 18, 1972

3,677,853
WAFER MOUNTING

Thomas A. Anzelone, Jr., Fort Lauderdale, Harold A. Larson, University Park, and Alfred A. Stricker, Pompano Beach, Fla., assignors to International Business Machines Corporation, Armonk, N.Y.

Filed Dec. 30, 1969, Ser. No. 889,112
Int. Cl. B32b *31/00*
U.S. Cl. 156—160 5 Claims

ABSTRACT OF THE DISCLOSURE

Wafers are bonded to a carrier surface which tends to bulge in reaction to the bonding process, particularly heating, but to return to a flat configuration after bond curing. Void-free bonding is obtained by shaping the bonding material to the carrier bulge and introducing the wafer to the high point of the bulge relative to the flat surface of the carrier. Closure pressure between wafer and carrier and the reaction of the carrier in cooling to a substantially flat surface configuration cooperate to complete the bonding.

BACKGROUND OF THE INVENTION

(1) Field of the invention

This invention relates to the art of bonding two surfaces together. More particularly, this invention relates to the art of bonding thin wafers to carriers or base structures where the bonding surface of the carrier tends to assume a convex bulge during the bonding process and return to a flat configuration after bond cooling. The invention is particularly useful for bonding wafers containing a multitude of grown crystal circuits onto flat carriers so that the circuits can be cut into appropriate chips for use in electronic circuit component fabrication.

(2) Description of the prior art

Manufacturing of miniature electronic components has progressed to the point where a myriad of circuits can be "grown" onto a single silicon base wafer. These circuits must then be cut into separate chips. Since the wafers are extremely fragile, they must be mounted upon a carrier before the cutting operation can be performed. This carrier is typically a plastic or phenolic disk considerably thicker than the wafer. In the past, the wafer has been mounted upon the carrier by heating the carrier, depositing a pre-heated bonding agent thereon, placing the wafer on the bonding agent and forcing the wafer and carrier together while working out the bubbles or voids from the bonding agent. A bonding agent which has been typically used for this process is glycol phalate, a high molecular weight thermoplastic polymer. The chips were then cut or diced by use of slurry cutting techniques.

As long as the wafers were relatively small, such as 1¼ inch diameter or less, the foregoing process was reasonably satisfactory. However, as larger wafers were produced such as 2.5 inch diameter, significant problems began developing both in cracking of the wafer during mounting as well as in damage to the slurry saw. Damage to the saw and sometimes to the wafer itself was encountered as a result of the trapping of air or voids between the wafer and the carrier. Thus, the percentage of failures in wafer mounting and dicing operations increased radically as the diameter of the manufactured wafer increased.

SUMMARY OF THE INVENTION

The present invention is a process for mounting a semi-conductor wafer on a plastic carrier for a subsequent processing operation. During the mounting or bonding operation of this invention, the plastic carrier and the bonding material, typically glycol, are preheated. It has been found that the carrier assumes a convex bulge shape on to the surface to which the wafer is to be mounted when it has been so heated. Thus, the glycol is dispensed on to the surface of the heated carrier and is spread to a convex shape by means of a polished preform tool which has a small convex cup configuration. By use of the preform tool, the glycol is formed into a relatively uniform coating on this carrier. The wafer is then placed in position so that the initial contact is made at the highest point of the convex bulge of the wafer. The wafer is allowed to partially preheat while at that location which concurrently causes cooling of the bulged carrier around the high point. Pressure is applied to force the wafer towards the surface of the carrier to which bonding is to be effected and, by so doing, the glycol is forced outwardly thereby eliminating voids. The convex shape of the bonding material permits the wafer to absorb heat gradually so that no cracking of the wafer occurs from thermal shock. In addition, the convex shape facilitates the elimination of trapped air between wafer and the carrier so that the chips and equipment are not damaged during the subsequent dicing operation. After a brief period, the pressure against the wafer can be removed since the piston action of the carrier surface in returning to a substantially flat configuration while cooling will cause the wafer to completely bond across its entire bonding surface.

After the foregoing bonding procedure, state-of-the-art cutting techniques such as slurry saws can be used to dice the chips which are subsequently removed by a washing process. For washing glycol bonded chips, acetone is typically employed.

An object of this invention is to provide substantially void-free bonding of two surfaces wherein one of the surfaces assumes a convex bulge during preparation for the bonding process.

Yet another object of the present invention is to provide a process for bonding semi-conductor wafers to plastic carriers for subsequent dicing operations.

Still another object of the present invention is to provide a process for bonding relatively thin wafers to carriers or base structures wherein the bonding surface of the carrier or substrate assumes a convex bulging configuration during the bonding process and returns to a substantially flat configuration after bonding.

Yet another object of this invention is to provide a process for bonding wafers to carriers so that the wafer will not be cracked despite its fragility while the bond is accomplished without voids or air pockets.

The foregoing and other objects, features and advantages of the present invention can be more fully understood from the following detailed description of the present invention.

DETAILED DESCRIPTION

Figure 1:
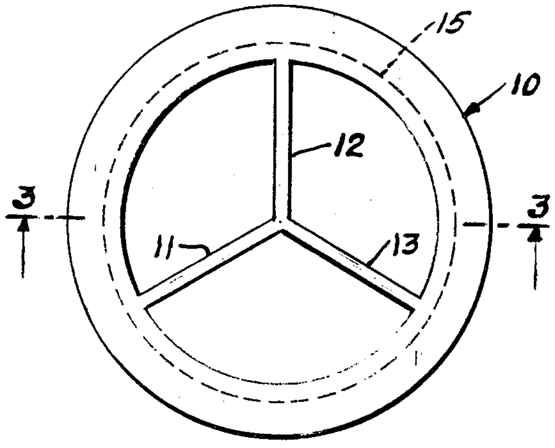
FIG. 1 is a bottom view of a typical plastic carrier on which the wafers can be mounted.

A phenolic carrier 10 typically used for mounting semi-conductor wafers is shown in FIG. 1. FIG. 1 is a bottom view of carrier 10 and shows the recessed portion therein which contains reinforcing ribs 11, 12 and 13. An upper cup 15 completes the carrier and is shown more clearly in the side view presented by FIG. 2.

Figure 2:
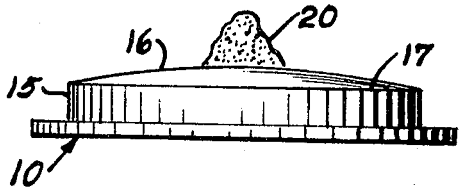
FIG. 2 shows a side view of the carrier of FIG. 1 illustrating the substantially convex bulge on the mounting surface thereof with the initially deposited bonding agent.

The carrier 10 during the bonding process is preheated to about 300° F.–350° F. and, as a result, the upper cap 15 assumes a convex bulge 16 as can best be seen in FIG. 2. This convex bulge for a carrier designed to handle a wafer of 2.25 inch diameter would assume a height of approximately .009 inch from the normally flat plane 17 of the upper surface of cap 15. After cooling, the upper surface of cap 15 returns to within .001 inch of the flat plane 17. The actual warpage in a given situation can be easily determined as a function of temperature, the dimensions mentioned herein being cited for phenolic carriers for exemplary purposes only.

In the past, with small diameter carriers, no significant problems were encountered in simply depositing the bonding agent such as glycol on the carrier surface and pressing the wafer into place after which the assembly is allowed to cool. However, as it became necessary to provide larger diameter carriers for handling larger diameter wafers, the wafers were cracking in a substantial number of cases. This cracking occurred either during the process of trying to work out all of the voids which occurred in the bonding agent or else during the cooling process. It is believed that the cracking during the cooling process resulted from the returning of the convex bulge to a flat configuration which pulled the wafer downward in the middle while the glycol thickness towards the outer edges produced a cracking force. Cracking of the wafer while attempting to work out voids and bubbles probably was a result of this same bulging. Additionally, a greater number of voids were being left in the glycol resulting in more incidents of saw and wafer damage during subsequent cutting.

The present invention resolves the cracking and glycol void problems by controlling the amount and thickness of the glycol bonding material as well as providing a controlled introduction of the wafer to the carrier surface. Furthermore, it is possible by use of the present invention to produce an assembly wherein the top of the wafer and the bottom of the base are parallel after bonding so as to facilitate the dicing operation. That is, since the tolerance of parallelism between the wafer and base is accurately controlled by the present invention, cutting of the chips can be accomplished without disturbing the plastic carrier or base so that this base is reuseable after washing of the chips by acetone.

Commercially available dispensers preheat the glycol and can permit its deposit at the preheated temperature upon the surface of carrier 10 as is shown by the glycol 20 in FIG. 2. These commercially available dispensers are typically used for preheating epoxies and they maintain the glycol in its preheated state up to the dispensing nozzle. Furthermore, these devices can accurately meter the amount of material which is being dispensed. By use of the present invention, the thus deposited glycol can be spread to compensate for the warpage of the carrier.

Figure 3:
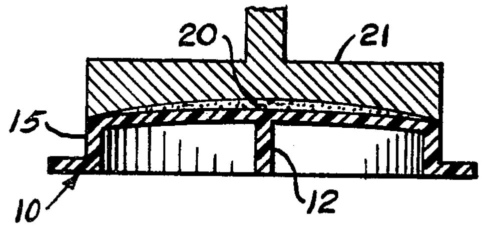
FIG. 3 presents a cross-sectional view of the forming of the bonding agent by a preform tool.

After the preheated glycol portion 20 has been deposited on carrier 10, it is shaped into a convex contour by a special preform tool 21. This is shown in the cross-sectional view of FIG. 3. The preform tool 21 is cooled relative to base 10 and glycol 20. Tool 21 has a special contour to leave a convex layer of glycol by forming a thin crust on the surface thereof for a brief period. In practice, it has been found that an aluminum disk having a highly polished cup performs this function sufficiently with the tool being maintained at ambient temperature. However, it can be appreciated that special cooling could be included in the preform tool, if desired. The cooling is important for causing the crust formation to hold the glycol in the desired configuration and for permitting release of the preform tool.

Figure 4:
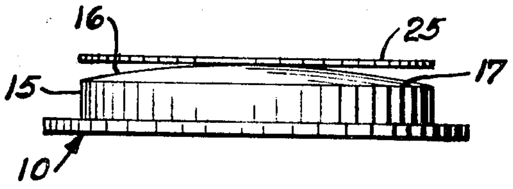
FIG. 4 shows the orientation of the wafer when it is initially introduced to the bonding agent coated surface of the carrier.

The semi-conductor wafer 25 is then placed for a brief period so that it is in contact with the high point of the glycol coated crown of carrier 10. This is illustrated in FIG. 4 wherein wafer 25 is shown contacting the highest point of the crown in bulge 16 relative to the normal flat plane 17. The wafer is then allowed to partially preheat through this contact point to avoid thermal shock. In addition, the carrier 10 begins to cool in the area around this high point and contract towards flat plane 17.

Figure 5:
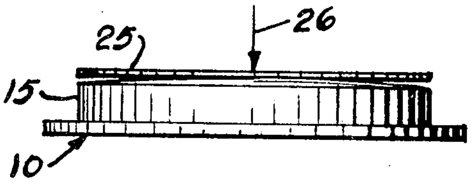
FIG. 5 shows the orientation of the wafer relative to the carrier when the bonding process is substantially completed.

Force is added by arrow 26 in FIG. 5 to bring wafer 25 downward towards the flat plane surface 17 of the carrier 10. This force is continued during most of the retracting of the warpage of 10. Continued cooling of carrier 10 and wafer 25 along with the setting of the bonding agent causes the entire assembly to return to a substantially flat configuration as shown in FIG. 5 with all air between wafer 25 and carrier 10 being forced radially outwardly so that voids are not formed. After a predetermined time, the pressure is removed at which point the wafer is at approximately 90% of its final mounting position. By allowing the entire assembly to continue cooling, it will assume a completely bonded position with no voids and with complete bonding between the carrier and the wafer.

Timing of this operation has not been found to be significantly critical. Satisfactory operation had been obtained by, after preheating the carrier and dispenser, using negligible time to dispense the glycol and shape the glycol by the performing operation. About 5 seconds is allowed for the crust of the glycol to obtain plastic state again, after which the wafer is introduced and held in the preheating position for about 1–3 seconds. After preforming, no more than 10 or 12 seconds should be allowed to elapse or the glycol will begin to form pockets. The wafer preheat position is held for from 1 to 3 seconds and the entire assembly is allowed to cool approximately one minute after pressure is removed. This insures that the carrier can be moved without changing the position of the wafer.

As can be seen from the foregoing description, the present invention has converted the carrier warpage from a problem into an advantage in that it gives the desired contour for placing a wafer on a glycol covered carrier so as to eliminate trapping of air. Further thermal shock of the wafer is reduced by use of the center-out heat transfer causing reflow of glycol to be gradual from the center outwardly thus eliminating shock on the wafer. The glycol crown also allows the wafer to be loaded with less force letting reflow determine the rate of placement speed and preventing damage to the wafer pattern. Cooling the glycol center faster than the outer circumference allows warpage to return to its original position forcing the wafer to seat itself relative to the carrier.

Although the preform tool sets the outer crust on the glycol, it still allows the material to flow under the control of the preform shape of the tool. This tool can be removed without sticking to the glycol. Upon removal of the preform tool, the glycol material regains heat from the plastic carrier and is then ready for placement of the wafer. The wafer loading can be accomplished by use of a vacuum loading ram that is rubber coated to protect the chips. The entire process can be obviously automated or various hand operated steps can be performed.

While the invention has been shown and described with reference to the preferred embodiment thereof, it will be understood by those skilled in the art that the foregoing and other changes of form and detail may be made therein without departing from the spirit and scope of the invention.

What is claimed is:

1. A process for void-free bonding of first and second flat surfaces wherein said first surface attains a convex bulge during preparation for the bonding process but returns to a substantially flat configuration during bond curing comprising the steps of:

performing the initial preparation of said surfaces which causes the convex bulge on said first surface, depositing a portion of bonding material on said first surface, forming said bonding material into conformity with said first surface by use of a tool having a concave surface of a configuration compatible with the convexity of said first surface, introducing said second surface to said bonding material at the highest point relative to the flat plane of said first surface, and permitting the bond to cure so that said second surface is forced into parallel bonded relation to said first surface while forcing all voids in said bonding material outwardly from said high point.

2. The process in accordance with claim 1 wherein the preparation for bonding involves heating said first surface and said bonding material and wherein said permitting step includes the steps of:

bringing said second surface into initial contact with said high point, retaining said second surface in said initial contact position for a sufficient period of time to begin (a) heat transfer into said second surface and (b) cooling of said first surface so as to begin reducing the convexity thereof, and applying closure pressure between said surfaces for forcing potential voids in the bonding material.

3. The process for bonding a brittle wafer to a surface of a carrier which carrier surface assumes a convex surface configuration when heated but is substantially flat when cooled, comprising the steps of:

heating the carrier to the desired bonding temperature, dispensing a predetermined amount of preheated bonding material on to the convex surface of said carrier, spreading the bonding material so as to cover said carrier surface by pressure from a cooled preform tool having a concave surface compatible with said convex surface, and mounting said wafer on said carrier by moving said wafer so that the plane thereof closes in parallel with the plane of the said flat surface of said carrier thereby initially engaging the high point of said convex surface relative to the said flat plane of said carrier.

4. The process in accordance with claim 3 wherein said mounting step includes the steps of:

retaining said wafer in the position of initial contact with said high point to effect heat transfer into said wafer from the area of said high point and cooling of said area, and applying closure pressure between said wafer and said carrier for causing potential voids to be forced outwardly from said high point as said carrier cools and returns to its flat configuration.

5. The process in accordance with claim 4 wherein said wafer is a silicon base with crystal grown semi-conductor circuit structure thereon, said carrier is a phenolic disk, said bonding material is a high molecular weight, thermoplastic polymer, and said concave surface of said preform tool is highly polished.

References Cited

UNITED STATES PATENTS

| | | | |
|---|---|---|---|
| 3,492,763 | 2/1970 | Walsh | 51—281 X |
| 3,453,166 | 7/1969 | Herriott et al. | 156—295 |
| 2,437,212 | 3/1948 | Schottland | 156—295 X |
| 3,498,867 | 3/1970 | Stewart | 156—295 |
| 2,403,079 | 7/1946 | Higgins | 156—295 X |
| 3,397,278 | 8/1968 | Pomcrante | 29—472.9 X |
| 3,417,459 | 12/1968 | Pomcrante et al. | 29—472.9 |
| 3,475,867 | 11/1969 | Walsh | 51—281 |
| 3,316,628 | 5/1967 | Lang | 29—472.7 |
| 2,531,660 | 11/1950 | Zeigler | 156—295 |

BENJAMIN R. PADGETT, Primary Examiner

R. E. SCHAFER, Assistant Examiner

U.S. Cl. X.R.

29—472.9; 156—322, 165, 295